United States Patent [19]
Hirano et al.

[11] Patent Number: 5,561,321
[45] Date of Patent: Oct. 1, 1996

[54] CERAMIC-METAL COMPOSITE STRUCTURE AND PROCESS OF PRODUCING SAME

[75] Inventors: Masanori Hirano, Toyoake; Noriyoshi Yamauchi, Yokkaichi, both of Japan

[73] Assignee: Noritake Co., Ltd., Aichi-ken, Japan

[21] Appl. No.: 146,086

[22] PCT Filed: Jul. 2, 1993

[86] PCT No.: PCT/JP93/00918

§ 371 Date: Nov. 8, 1993

§ 102(e) Date: Nov. 8, 1993

[30] Foreign Application Priority Data

Jul. 3, 1992 [JP] Japan .................................. 4-176428
May 20, 1993 [JP] Japan .................................. 5-143033

[51] Int. Cl.$^6$ .......................... H01L 23/14; H01L 23/15; B32B 5/14; B32B 5/18
[52] U.S. Cl. ......................... 257/700; 257/706; 437/218; 428/610; 428/613; 428/620; 428/665; 361/708; 361/712
[58] Field of Search ..................... 257/701–703, 257/705, 706, 700, 675; 437/192, 218; 361/705, 708, 712; 428/610, 615, 618, 632, 620–623, 627–630, 660–665, 613

[56] References Cited

U.S. PATENT DOCUMENTS

5,126,102  6/1992  Takahashi et al. .................. 428/610

FOREIGN PATENT DOCUMENTS

| 0041879 | 4/1981 | Japan . |
| 0163093 | 12/1981 | Japan . |
| 0013515 | 3/1982 | Japan . |
| 0177634 | 9/1985 | Japan . |
| 0005983 | 1/1989 | Japan . |
| 0137069 | 5/1991 | Japan . |

*Primary Examiner*—Peter Toby Brown
*Attorney, Agent, or Firm*—Oliff & Berridge

[57] ABSTRACT

A composite substrate 30 is constituted by an alumina substrate 16, a metallic layer 34, and a copper sheet 26 bonded to the alumina substrate 16 via the metallic layer 34. The metallic layer 34 is constituted by a tungsten sub-layer 34a having a low coefficient of thermal expansion, a tungsten/silver-copper alloy mixture sub-layer 34b, and a silver-copper alloy sub-layer 34c having a high coefficient of thermal expansion. In the mixture sub-layer 34b, the ratio of the percentage content of the silver-copper alloy to that of the tungsten increases with distances from the alumina substrate 16.

20 Claims, 5 Drawing Sheets

CERAMIC-METAL COMPOSITE STRUCTURE AND PROCESS OF PRODUCING SAME

This application was filed under 35 U.S.C. §371 and claims priority of PCT application Ser. No. JP93/00918, filed Jul. 2, 1993.

FIELD OF THE INVENTION

The present invention relates to a ceramic-metal composite structure and a process of producing the same.

BACKGROUND OF THE INVENTION

Since a sintered body of a ceramic such as alumina, silicon nitride, or aluminum nitride exhibits excellent heat resistance, wear resistance and electrically insulating performance, it is widely used as a semiconductor substrate, automotive part, etc. When a sintered ceramic body is applied to a power semiconductor module, engine part, or external wall of a rocket or airplane, it should additionally have high heat-radiating capability. However, generally, a sintered ceramic body suffers from low thermal conductivity. In such cases, therefore, a metallic body (e.g., copper sheet) having high thermal conductivity is bonded to a sintered ceramic body, for increasing the heat-radiating capability of the ceramic body.

Meanwhile, since a sintered body of a ceramic such as alumina, aluminum nitride oxide, aluminum nitride, or boron nitride, or a composite body of two or more of those sintered ceramic bodies exhibits relatively high thermal conductivity and electrically insulating performance, among various sintered ceramic bodies, and additionally has excellent mechanical properties, a circuit pattern in the form of a metal sheet such as copper sheet is bonded to the sintered ceramic body or composite ceramic body so as to provide a composite structure as a semiconductor-mounting substrate on which a heat-generating device such as an IC package or power semiconductor is mounted.

The above composite structure is produced, e.g., by a process wherein a metallic body is brazed to a sintered ceramic body using, e.g., a silver brazing filler, or by a process wherein first a sintered ceramic body is held in contact with a metallic body and subsequently the two bodies are bonded to each other by eutectic reaction caused in an appropriate atmosphere as disclosed in Japanese Patent Application laid open for opposition under No. 57(1982)-13515.

However, the coefficient of thermal expansion of a commonly used sintered ceramic body falls within the range of $3 \times 10^{-6}$ to $10 \times 10^{-6}$/°C., whereas metal such as copper or stainless steel has a thermal expansion coefficient falling within the higher range of $16 \times 10^{-6}$ to $18 \times 10^{-6}$/°C. Thus, the above-described composite structure has a large difference between the thermal expansion coefficients of the sintered ceramic body and the metallic body bonded to each other. Therefore, the composite structure suffers from stresses (i.e., thermal stresses) caused by that difference, when the composite structure is subjected to temperature changes in the bonding step or during its service. Those thermal stresses may cause peeling at the interface of bonding of the two bodies, or may cause cracks in the sintered ceramic body if the mechanical strength of the ceramic body is lower than the stresses. For overcoming the those problems, it has been practiced to provide, at the bonding interface of a sintered ceramic body and a metallic body, a buffer material which has a thermal expansion coefficient intermediate between those of the two bodies. Meanwhile, Japanese Non-Examined Patent Application laid open under No. 56(1981)-41879 discloses the technique of interposing, between a sintered ceramic body and a metallic body, a buffer material which has high ductility and therefore is plastically deformable largely enough for absorbing the thermal stresses generated between the two bodies. However, in the above-indicated first technique, there still remains a considerable difference between the thermal expansion coefficients of the buffer material and the sintered ceramic body, so that thermal stresses due to that difference are produced in the composite structure. Meanwhile, in the above-indicated second technique, the plastic deformation of the buffer material may not be so large as to absorb the thermal stresses generated, if those stresses are very large.

The present invention has been developed in the above-described background. It is therefore an object of the present invention to provide a ceramic-metal composite structure free from problems such as peeling of a metallic member from a sintered ceramic body, or generation of cracks in the sintered ceramic body, each due to temperature changes.

DISCLOSURE OF INVENTION

The above object has been achieved by the present invention, which provides a ceramic-metal composite structure including a sintered ceramic body and a metallic layer bonded to a surface of at least a portion of the sintered ceramic body, characterized in that the metallic layer is formed of a metal having a high melting point such that density of the metallic layer after being sintered continuously or stepwise decreases, or porosity of the metallic layer continuously or stepwise increases, with distances from the surface of the sintered ceramic body, the metallic layer having pores in which copper or a silver/copper-based alloy is contained, so that a ratio of a percentage content of the copper or the silver/copper-based alloy to a percentage content of the high-melting-point metal continuously or stepwise increases with the distances from the surface of the sintered ceramic body.

In the ceramic-metal composite structure constructed as described above, the metallic layer bonded to the sintered ceramic body has the characteristic that the ratio of the percentage content of the copper or silver/copper-based alloy to that of the high-melting-point metal continuously or stepwise increases with distances from the surface of the ceramic body. Therefore, the coefficient of thermal expansion of the metallic layer is relatively small near the sintered ceramic body and relatively great away from the ceramic body. Since the thermal expansion coefficient, about $5 \times 10^{-6}$/°C., of the high-melting-point metal such as tungsten or molybdenum is smaller than that, $16 \times 10^{-6}$ to $18 \times 10^{-6}$/°C., of the copper or silver/copper-based alloy, the metallic layer has different thermal expansion coefficients intermediate between those of the two substances, depending upon ratios of the percentage content of one of the two substances to that of the other substance. Therefore, the difference between the thermal expansion coefficients of the sintered ceramic body and the metallic layer is reduced at the bonding interface of the two elements, which leads to reducing the thermal stresses produced at that interface because of that difference when the composite structure is subject to temperature changes. Consequently the composite structure is free from peeling at the above-indicated interface, or cracks in the sintered ceramic body.

Preferably, the composite structure further comprises a nickel layer provided at an interface of the high-melting-point metal and the copper or the silver/copper-based alloy in the metallic layer. This ceramic-metal composite structure is advantageous in that the high-melting-point metal and the copper or silver/copper-based alloy are bonded to each other with higher strength and therefore the metallic layer as a whole becomes denser and exhibits higher thermal conductivity.

Preferably, the composite structure further comprises a metallic body bonded to the sintered ceramic body via the metallic layer. This ceramic-metal composite structure is advantageous in that the thermal stresses produced by the thermal expansion of the metallic body due to temperature changes are effectively relaxed by the metallic layer. Therefore, the composite structure is free from peeling or cracks and serves with higher reliability. Additionally, the heat generated on the sintered ceramic body is effectively radiated by the metallic body bonded thereto. Thus, the composite structure is suitable for use as a semiconductor substrate, engine part, external wall of a rocket, or other parts which should have high heat-radiating capability in addition to high insulating performance and heat resistance.

Preferably, the composite structure further comprises, in addition to the metallic layer as a first metallic layer, a second metallic layer identical with the first metallic layer; and, in addition to the metallic body as a first metallic body, a second metallic body bonded to the sintered ceramic body such that the first and second metallic bodies are bonded to opposite surfaces of the sintered ceramic body via the first and second metallic layers, respectively. This ceramic-metal composite structure is advantageous in that, even in the case where thermal stresses are produced between the sintered ceramic body and each of the two metallic bodies because of temperature changes, the stresses produced in one face of the ceramic body are comparable to the stresses produced in the other face of the ceramic body and therefore the former and latter stresses compensate for each other. When the composite structure is used in the above-indicated applications, it operates with higher reliability against temperature changes.

Preferably, the composite structure further comprises a layer of the copper or the silver/copper-based alloy provided on a surface of the metallic layer. This ceramic-metal composite structure is advantageous in that a member such as the above-described metallic body is bonded to the metallic layer with good wettability with respect to a brazing filler or solder and therefore with higher bonding strength. Even in the case where thermal stresses are produced between the sintered ceramic body and the member bonded thereto because of temperature changes, the thermal stresses are not so large as to cause peeling between the sintered ceramic body and the member bonded thereto.

Preferably, the metallic layer comprises, adjacent to the sintered ceramic body, a lowermost sub-layer consisting essentially of the high-melting-point metal. This ceramic-metal composite structure is advantageous in that the sintered ceramic body and the metallic layer are bonded to each other with higher strength.

Preferably, the high-melting-point metal is tungsten or molybdenum. Tungsten and molybdenum each have a low coefficient of thermal expansion as described above, and also have a high coefficient of thermal conductivity. Therefore, this ceramic-metal composite structure is advantageous in that the heat generated on the sintered ceramic body is effectively radiated through the metallic layer.

Preferably, the metallic layer is formed of a composition containing, in addition to the high-melting-point metal, not more than 30% by weight of at least one of one or more constituents of the sintered ceramic body. This ceramic-metal composite structure is advantageous in that the metallic layer is bonded to the sintered ceramic body with higher strength. Therefore, the composite structure works for a longer period of time without peeling between the metallic layer and the sintered ceramic body.

Preferably, the metallic body is formed of one selected from copper, copper alloys, copper-plated metals, copper-cladded metals, and nickel. Each of these metallic bodies has good wettability with respect to the above-described copper or silver/copper-based alloy, and therefore it is bonded via the metallic layer to the sintered ceramic body with higher strength.

Preferably, the sintered ceramic body provides a substrate for a copper sheet or a copper-alloy sheet as the metallic body. When this ceramic substrate is applied to a power semiconductor module, piezoelectric element-actuating semiconductor module, etc., the heat generated from a semiconductor or electronic device provided on the ceramic substrate is radiated by the metallic body, and therefore the temperature rise of the ceramic substrate is effectively restricted. Additionally, since no peeling or crack occurs when the ceramic substrate is subject to temperature changes as described above, the ceramic substrate is advantageously used with a semiconductor, electronic device, etc. which generates a large amount of heat.

Preferably, the above ceramic substrate comprises a circuit pattern as at least a portion of the copper or copper alloy sheet. This ceramic substrate enables use of a heavy current thereon, without causing peeling of the circuit pattern because of temperature changes. Thus, the ceramic substrate is used with the circuit pattern with high reliability.

Preferably, the sintered ceramic body is constituted by a sintered alumina body or a sintered aluminum nitride body. This ceramic-metal composite structure has excellent thermal conductivity, insulating performance, mechanical properties, etc., and therefore it is suitable for use as a substrate for a semiconductor, electronic device, etc., as described above.

Preferably, the composite structure further comprises a semiconductor chip bonded to at least a portion of the metallic body, for providing a power semiconductor module.

Preferably, the above power semiconductor module further comprises, in addition to the metallic layer as a first metallic layer, a second metallic layer identical with the first metallic layer; in addition to the metallic body as a first metallic body to which the semiconductor chip is bonded, a second metallic body bonded to the sintered ceramic body such that the first and second metallic bodies are bonded to opposite surfaces of the sintered ceramic body via the first and second metallic layers, respectively; and a heat sink bonded to the second metallic body. This ceramic-metal composite structure is advantageous in that the heat generated from the semiconductor chip or others are more effectively radiated by the heat sink, and therefore the composite structure serves as a power semiconductor module with higher reliability.

According to the present invention, there is also provided a process of producing a ceramic-metal composite structure, characterized by including a metalizing step of forming, on a surface of at least a portion of a sintered ceramic body, a porous metallic layer using a high-melting-point metal such that porosity of the metallic layer continuously or stepwise increases with distances from the surface of the sintered ceramic body, the metallic layer having a multiplicity of externally open pores, and an impregnating step of impregnating, in the metallic layer, copper or a silver/copper-based alloy.

In the ceramic-metal composite structure producing process as arranged above, the copper or silver/copper-based alloy is impregnated into the multiplicity of externally open pores of the metallic layer formed of the high-melting-point metal such that porosity of the metallic layer continuously or stepwise increases with distances from the surface of the sintered ceramic body. Therefore, the copper or silver/copper-based alloy is distributed in the metallic layer such that the distribution of the copper or alloy corresponds to the continuous or stepwise change of the porosity. Thus, the ceramic-metal composite structure is easily produced and includes the metallic layer in which the ratio of the percentage content of the copper or silver/copper-based alloy to that of the high-melting-point metal increases with distances from the surface of the sintered ceramic body.

Preferably, the producing process further comprises, before the impregnating step, a step of forming a nickel layer on internal surfaces of the metallic layer which define the externally open pores in the metallic layer. Since the nickel layer improves the wettability of the copper or silver/copper-based alloy with respect to the high-melting-point metal, the copper or silver/copper-based alloy is impregnated down to a low-porosity portion of the metallic layer near the sintered ceramic body.

Preferably, the metalizing step comprises a laminating step of laminating at least two metallic sub-layers on a surface of a formed ceramic body or a sintered ceramic body, by printing using at least two kinds of metal-based pastes each of which contains as an essential constituent thereof the high-melting-point metal and which have different porosities after being sintered, in an order that a paste having a lower porosity after being sintered is printed before a paste having a higher porosity after being sintered; and a sintering step of firing, after the laminating step, the laminated metallic sub-layers and the formed or sintered ceramic body under prescribed conditions. In this case, the metallic layer which has the multiplicity of externally open pores and whose porosity continuously or stepwise increases with the distances from the surface of the sintered ceramic body, is easily formed of the high-melting-point metal by preparing an appropriate number of different high-melting-point-metal-based pastes and laminating the corresponding number of metallic sub-layers on one another by printing using the prepared pastes.

Preferably, the metalizing step comprises a laminating step of laminating at least two metallic sub-layers on a surface of a formed ceramic body or a sintered ceramic body, by superposing at least two green sheets each of which contains as an essential constituent thereof the high-melting-point metal and which have different porosities after being sintered, in an order that a paste having a lower porosity after being sintered is printed before a paste having a higher porosity after being sintered, and subsequently compressing the laminated metallic sub-layers; and a sintering step of firing, after the laminating step, the laminated metallic sub-layers and the formed or sintered ceramic body under prescribed conditions. In this case, the metallic layer which has the multiplicity of externally open pores and whose porosity continuously or stepwise increases with the distances from the surface of the sintered ceramic body, is easily formed of the high-melting-point metal by preparing an appropriate number of different high-melting-point-metal-based green sheets, superposing the corresponding number of the prepared green sheets on one another, and compressing the superposed green sheets.

Preferably, the impregnating comprises a step of forming a layer of the copper or the silver/copper-based alloy on a surface of the metallic layer opposite to the surface thereof bonded to the sintered ceramic body; and a step of heating the layer of the copper or the silver/copper alloy on the metallic layer under prescribed conditions. The layer of the copper or silver/copper-based alloy formed on the metallic layer is melted when being heated, and thus the copper or alloy is easily impregnated into the externally open pores of the metallic layer.

Preferably, the step of forming the layer of the copper or the silver/copper-based alloy comprises a step of placing a foil of the copper or the silver/copper-based alloy on the surface of the metallic layer opposite to the surface thereof bonded to the sintered ceramic body. Thus, the layer of the copper or silver/copper-based alloy is easily formed on the metallic layer.

Preferably, the step of forming the layer of the copper or the silver/copper-based alloy comprises a step of printing using a paste of the copper or the silver/copper-based alloy on the surface of the metallic layer opposite to the surface thereof bonded to the sintered ceramic body. In this manner, too, the layer of the copper or silver/copper-based alloy is easily formed on the metallic layer.

Preferably, the impregnating comprises a step of forming a layer of the copper or the silver/copper-based alloy on a surface of the metallic layer opposite to the surface thereof bonded to the sintered ceramic body; a step of placing a metallic body in contact with a surface of the layer of the copper or the silver/copper-based alloy opposite to the surface thereof in contact with the metallic layer; and a step of heating, under prescribed conditions, the layer of the copper or the silver/copper-based alloy in contact with the metallic body and the metallic layer. In the impregnating step, the metallic body is bonded to the sintered ceramic body simultaneously with the impregnation of the copper or silver/copper-based alloy into the metallic layer.

BEST MODE FOR CARRYING OUT THE INVENTION

There will be described in detail one embodiment in accordance with the present invention by reference to the accompanying drawings.

Figure 1:
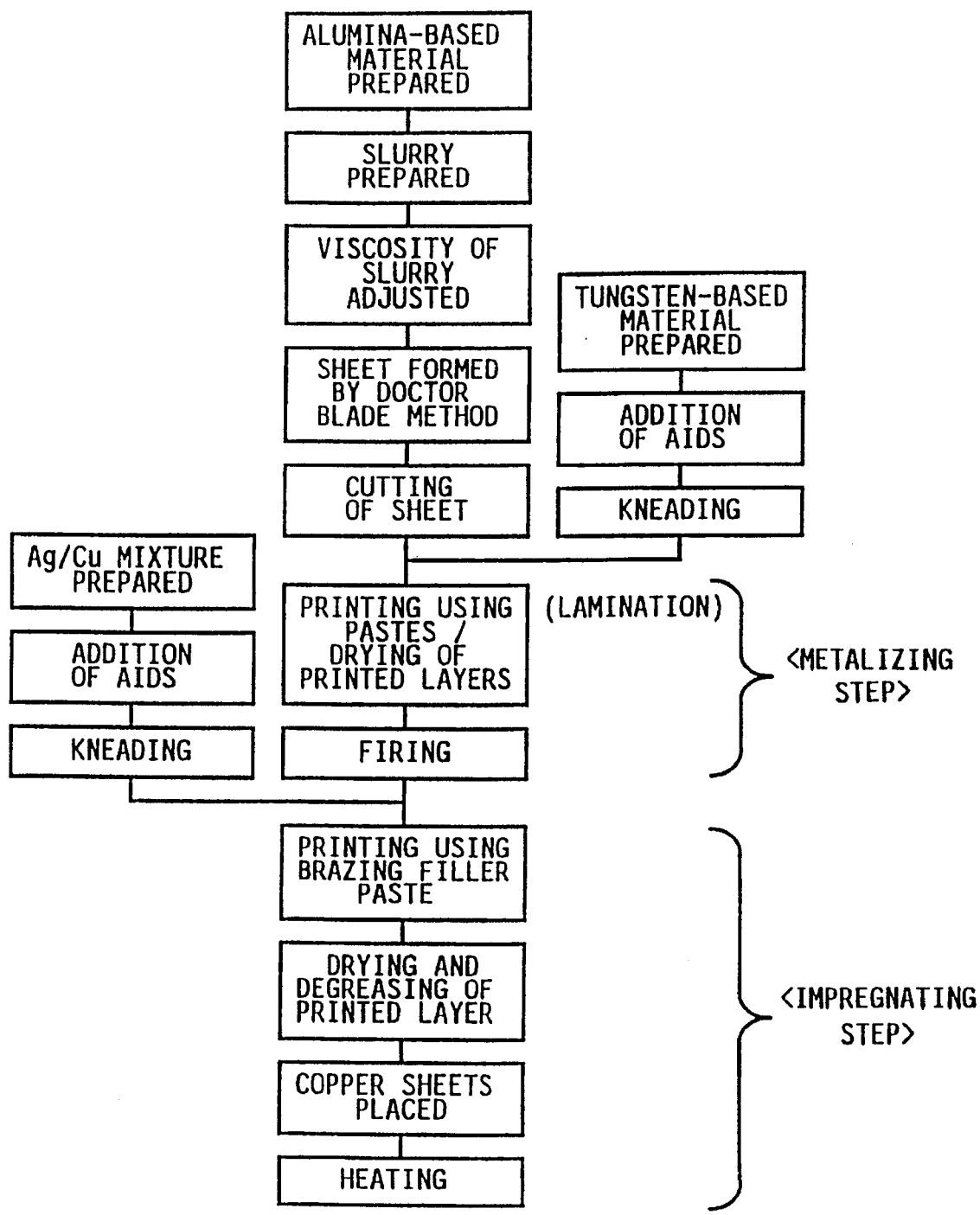
FIG. 1 is a flow chart representing steps carried out in one embodiment of the present invention.

FIG. 1 is a flow chart representing steps carried out in the present embodiment. An alumina-based material is prepared using 94% by weight of alumina $Al_2O_3$, such that the balance of the material consists of sintering aids such as calcium oxide CaO, magnesium oxide MgO, and silicon dioxide $SiO_2$, and traces of inevitable impurities. The alumina-based material is mixed with, e.g., a methacrylate resin so as to provide an alumina-based slurry. After the alumina-based slurry is adjusted to an appropriate viscosity, the slurry is formed by, for example, the doctor blade method into a green sheet having a 0.77 mm thickness. Meanwhile, three kinds of tungsten-based materials are prepared using 90% by weight of three kinds of tungsten (W) powders (each with, e.g., a 99.9% purity) respectively having, e.g., a 1.0 µm, 2.4 µm, and 3.0 µm average grain size (hereinafter, abbreviated to "AGS"), each together with 10% by weight of an alumina-based powder having the same composition as that of the above-described alumina-based material used for forming the green alumina sheet. Each of the three tungsten-based materials is mixed with a vehicle containing, e.g., terpineol and ethyl cellulose as essential constituents thereof, and then each of the thus obtained three mixtures is kneaded using, e.g., a three-roll mill. Thus, three tungsten-based pastes, A (AGS; 1.0 µm), B (AGS; 2.4 µm), and C (AGS; 3.0 µm) are prepared.

Figure 2:
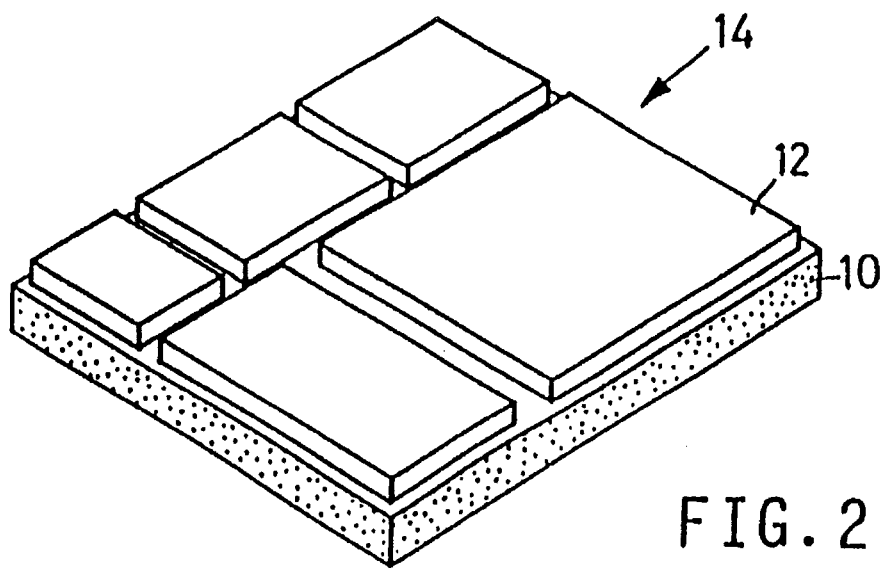
FIG. 2 is a perspective view of a green ceramic sheet on which a green metallic layer is formed by printing in a metalizing step of the flow chart of FIG. 1.
Figure 3:
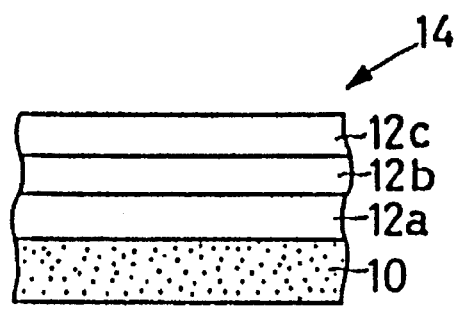
FIG. 3 is a cross-sectional view of a part of the green ceramic sheet and metallic layer of FIG. 2.

Subsequently, the above-described green alumina sheet is cut using, e.g., a cutter into several green alumina substrates 10 each having 62×42 mm dimensions. The three tungsten-based pastes A, B, C are used one by one in this order for forming, by printing, three green sub-layers 12a, 12b, 12c each having about 40 µm thickness, on each of opposite major surfaces of each of the green substrates 10. Each green sub-layer is dried at, e.g., about 80° C. before another green sub-layer is formed thereon. FIG. 2 shows a green composite body 14 constituted by the green alumina substrate 10, and upper and lower green tungsten layers 12 (only the upper layer 12 is shown) thus formed on the opposite surfaces of the green substrate 10. As shown in FIG. 3 that illustrates the partial cross-sectional view of the green composite body 14, each green layer 12 is constituted by the three green sub-layers 12a, 12b, 12c which are formed each with a predetermined thickness by printing using the three tungsten-based pastes A, B, C in this order. In the green composite body 14 shown in FIG. 2, the upper green layer 12 provides a predetermined circuit pattern in the upper face of the green body 14. FIG. 3 shows only the upper green layer 12 since the lower green layer 12 has a similar cross-sectional structure.

Figure 4:
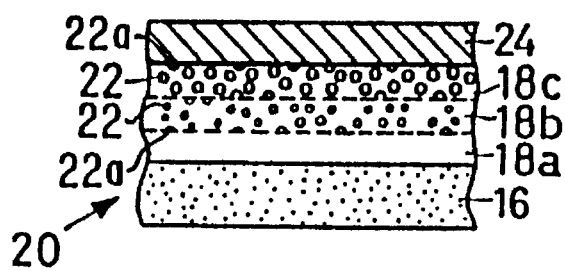
FIG. 4 is a cross-sectional view of a part of a metalized substrate produced in an impregnating step of the flow chart of FIG. 1.

The green composite bodies 14 are fired, e.g., in a $N_2/H_2$ mixture gas atmosphere at 1,600° C. The green alumina substrate 10 is fired into a sintered alumina substrate 16, and the two green tungsten layers 12 are fired into two metalizing layers (only the upper layer 18 is shown) on the opposite surfaces of the sintered alumina substrate 16. Thus, the green composite bodies 14 are fired into metalized substrates 20. As shown in FIG. 4, each metalizing layer 18 is constituted by three sintered sub-layers 18a, 18b, 18c each with a prescribed thickness which correspond to the above-described three green sub-layers 12a, 12b, 12c. Specifically, the first sintered sub-layer 18a corresponding to the first green sub-layer 12a and adjacent to the sintered alumina substrate 16, provides a compact or dense layer; the second sintered sub-layer 18b corresponding to the second green sub-layer 12b provides a porous layer having a multiplicity of pores 22 therein; and the third sintered sub-layer 18c corresponding to the third green sub-layer 12c provides a more porous layer than the second sintered layer 18b. Each of the porous layers 18b, 18c has pores 22, and a portion 22a of the pores 22 are externally open, as shown in FIG. 4. Thus, the metalizing layers 18 of each metalized substrate 20 have the characteristic that the porosity of each metalizing layer 18 stepwise increases with distances from the sintered alumina substrate 16. In the present embodiment, the green alumina substrate 10 serves as the formed ceramic body, the sintered alumina substrate 16 serves as the sintered ceramic body, and the metalizing layers 18 serve as the porous metallic layers each formed essentially of a metal having a high melting point.

Figure 5:
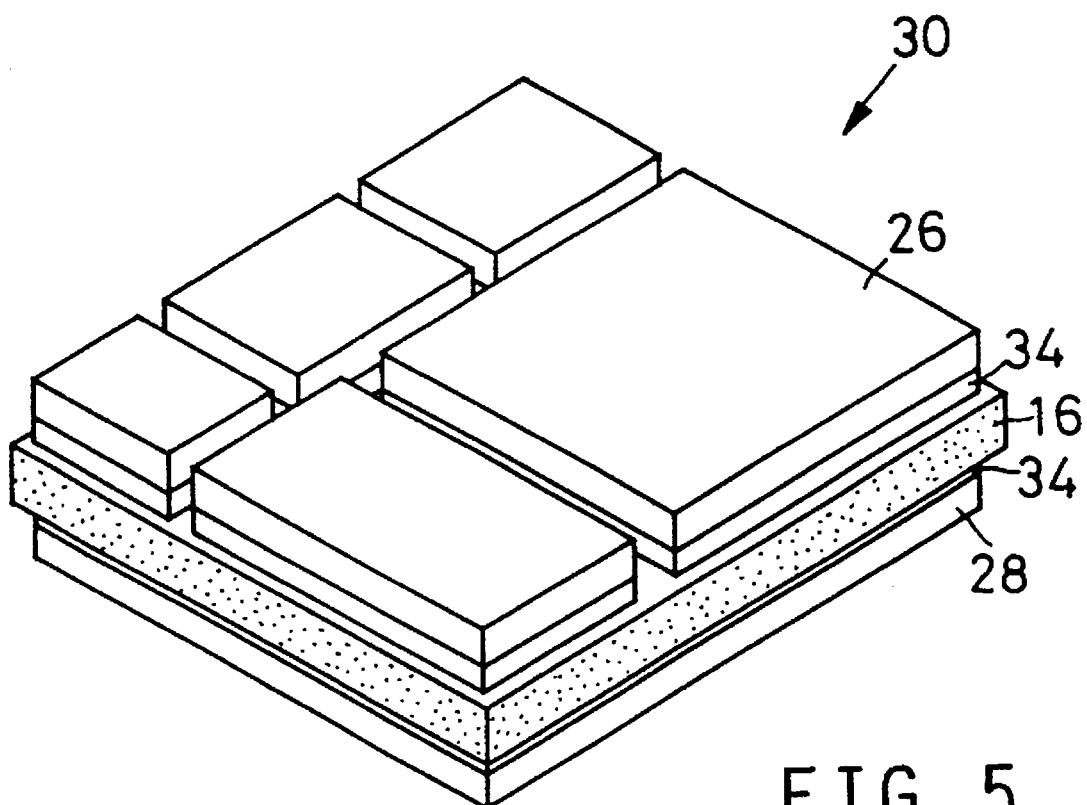
FIG. 5 is a perspective view of a composite substrate produced in the steps of the flow chart of FIG. 1.

Next, a silver/copper mixture is prepared by grinding and mixing, using an attritor, 72% by weight of silver (Ag) powder (with, e.g., a 1.3 µm AGS) and 28% by weight of copper (Cu) powder (with, e.g., a 1.5 µm AGS). The Ag/Cu mixture is mixed with, e.g., a vehicle containing ethyl cellulose and terpineol as essential constituents thereof, and then the obtained mixture is kneaded using a three-roll mill. Thus, a Ag/Cu brazing filler paste is obtained. The Ag/Cu brazing filler paste is used for forming, by printing, a brazing filler layer 24 with a 30 µm thickness, on each of the opposite faces of each metalized substrate 20. The brazing filler layers (only the upper layer 24 is shown) are dried, and then degreased in a $N_2$ atmosphere at 600° C. Subsequently, two oxygen-free copper sheets 26, 28 respectively having a 300 µm and a 350 µm thickness are placed on the brazing filler layers 24, respectively, in the opposite faces of each of some of the metalized substrates 20. With a 0.3 g/mm² load being applied via spacer members to the copper sheets 26, 28, the metalized substrates 20 are heated in an Ar atmosphere at 850° C. for 15 minutes. At the same time, identical metalized substrates 20 which however are free from copper sheets 26, 28 or a load applied thereto are heated under the same conditions. Thus, are produced composite substrates 30 one of which is shown in FIG. 5, and coated substrates free from copper sheets 26, 28. In the present embodiment, the Ag/Cu brazing filler provides the copper or silver/copper-based alloy which is contained or impregnated in the porous metallic layers.

Figure 6:
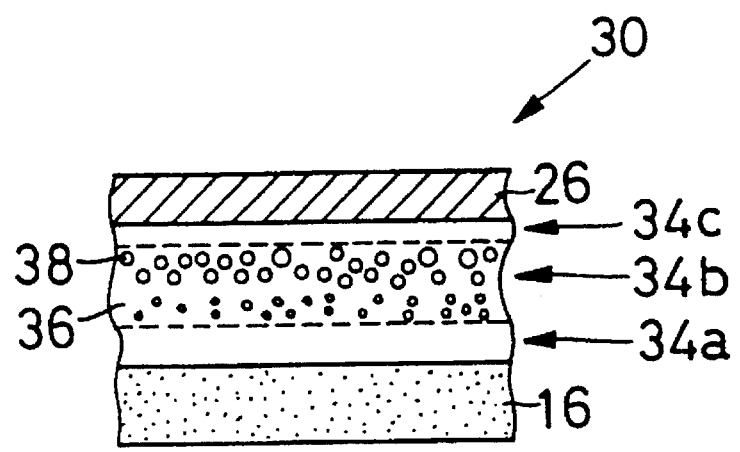
FIG. 6 is a cross-sectional view of a part of the composite substrate of FIG. 5.

The composite substrate 30 shown in FIG. 5 is constituted by the sintered alumina substrate 16, metallic layers 34, 34 adhered to the upper and lower surfaces of the alumina substrate 16, and the copper sheets 26, 28 bonded to the alumina substrate 16 via the metallic layers 34, 34. The copper sheet 26, placed on the metallic layer 34 which corresponds to the upper green tungsten layer 12 providing the circuit pattern shown in FIG. 2, provides a circuit pattern corresponding to the pattern of the upper green layer 12 or upper metalizing layer 18. As shown in FIG. 6 that illustrates the partial cross-sectional view of the composite substrate 30, each of the metallic layers 34, 34 is constituted by a tungsten layer 34a adjacent to the sintered alumina substrate 16 and free from silver-copper alloy; a tungsten/silver-copper alloy mixture layer 34b opposite to the alumina substrate 16 with respect to the tungsten layer 34a; and a silver-copper alloy layer 34c distant from the alumina substrate 16 and free from tungsten. For the same reasons as described above, the mixture layer 34b of each metallic layer 34 has the characteristic that the percentage content of the silver-copper alloy increases with distances from the alumina substrate 16. Specifically, in the mixture layer 34b, the ratio of the percentage content of the silver-copper alloy to that of the tungsten stepwise increases with the distances from the alumina substrate 16. In FIG. 6, reference numeral 36 denotes the tungsten, and reference numeral 38 denotes the silver-copper alloy, each contained in the mixture layer 34b of each metallic layer 34. In the present embodiment, the composite substrate 30 serves as the ceramic-metal composite structure, and the oxygen-free copper sheets 26, 28 serve as the first and second metallic bodies bonded to the composite structure. The above-described coated substrate includes metallic layers identical with the metallic layers 34, 34 of the composite substrate 30, and a suitable metallic body such as a copper sheet may be bonded, as needed, to one or each of opposite faces of the coated substrate by using, e.g., a silver brazing filler exclusively prepared for that use.

A peeling test was carried out to measure the bonding strength of the copper sheet 26 or 28 and the sintered alumina substrate 16 in the composite substrate 30. The measured bonding strength was about 17 kg/cm. At the same time, the bonding strength of a composite body produced by a conventional method (e.g., direct-bonding method using a brazing filler, or method using a buffering member) was measured, and the measured value, about 10 kg/cm, was lower than that of the composite substrate 30. The peeling test was carried out in such a manner that a nipper was connected to the copper sheet 26, 28 of the composite substrate 30 and a tensile tester was driven to pull the nipper biting the copper sheet in a direction perpendicular to the alumina substrate 16 and a tensile load at which the copper sheet was peeled was measured as the bonding strength of the composite substrate.

The thermal-shock resistance of the composite substrate 30 or the above-described coated substrate was measured by repeating, in a thermal-shock tester, a thermal-shock cycle consisting of a series of steps in which each substrate was cooled to −50° C. and held for 30 minutes and subsequently heated to 150° C. and held for 30 minutes. The adjustment of temperatures in the thermal-shock tester was very quickly performed by blowing a cooled or heated air into the tester. After 500 thermal-shock cycles, no crack or peeling was observed in the composite substrate 30 or the coated substrate. On the other hand, after about 50 cycles, cracks were observed in the composite body produced by the above-described conventional method which body was tested together with the composite substrate 30 and the coated substrate. Thus, the test results show that the composite substrate 30 and the coated substrate produced in the present embodiment exhibit high bonding strength and high resistance to temperature changes (i.e., temperature cycles).

In the composite substrate 30 or the coated substrate, each metallic layer 34 bonded to the sintered alumina substrate 16 includes a sub-layer formed of the tungsten only and having a low coefficient of thermal expansion (i.e., tungsten layer 34a) which layer is adjacent to the alumina substrate 16, and a sub-layer formed of the silver-copper alloy only and having a high coefficient of thermal expansion (i.e., silver-copper alloy layer 34c) which layer is opposite to the tungsten layer 34a in the metallic layer 34. Each metallic layer 34 further includes, between the tungsten layer 34a and the silver-copper alloy layer 34c, a sub-layer 34b that is formed of the tungsten mixed with the silver-copper alloy the percentage content of which increases with distances from the alumina substrate 16 and therefore that has the coefficients of thermal expansion which increase with the distances from the alumina substrate 16. Thus, the difference between the thermal expansion coefficients of each pair of adjacent sub-layers 34a, 34b, 34c in each metallic layer 34 is very small, thereby not producing any significant thermal stresses between the alumina substrate 16 and the corresponding copper sheet 26, 28 or metallic layer 34. That is, when the formation of the metallic layers 34, 34 and the bonding of the copper sheets 26, 28 are effected by being heated and cooled, the remaining of thermal stresses (i.e., residual stresses) due to the heating and cooling is very small. Consequently the composite substrate 30 or the coated substrate enjoys high bonding strength, and freedom from cracks or peeling due to temperature changes, as described above.

Since the composite substrate 30 produced in the present embodiment includes the copper sheet 28 bonded to one major face thereof and serving as a heat radiating member, it is advantageously used as a substrate for, e.g., a power semiconductor module which generates a great amount of heat. The heat generated from a semiconductor element provided on the module is effectively radiated by the copper sheet 28. The power semiconductor module enjoys high durability and reliability. Since the metallic layer 34 serving for bonding the sintered alumina substrate 16 and the copper sheet 28 to each other, is constituted by the considerably dense sub-layers each formed of one or both of the tungsten and the silver-copper alloy, the metallic layer 34 as a whole exhibit good thermal conductivity. Additionally, the above metallic layer 34 enjoys very small thermal stresses as described above. For these reasons, the composite substrate 30 is free from the problems of peeling and cracks.

In the present embodiment, three kinds of tungsten powders having different particle sizes, i.e., different sinterabilities are used for forming the green tungsten layer 12, i.e., laminating the three green sub-layers 12a, 12b, 12c on one another. Therefore, sintering the green layer 12 results in producing the metalizing layer 18 whose porosity increases with distances from the sintered alumina substrate 16. When the Ag/Cu brazing filler layer 24 is formed by printing on the metalizing layer 18 and subsequently heated, the silver-copper alloy resulting from melting of the Ag/Cu brazing filler is impregnated into the pores 22 of the metalizing layer 18. Thus, is easily obtained the metallic layer 34 in which the ratio of the percentage content of the silver-copper alloy to that of the tungsten increases with the distances from the alumina substrate 16. The first green sub-layer 12a adjacent to the alumina substrate 16 is formed of the tungsten paste A wherein the particle size of the tungsten powder contained therein and the sintering aids contained therein are so selected that the first green sub-layer 12a, when being sintered, provides a dense layer. Thus, the first green sub-layer 12a is sintered into the tungsten layer 34a free from the silver-copper alloy. In addition, since the paste A used for forming the first green sub-layer 12a contains the alumina-based powder having the same composition as that of the alumina-based material used for forming the alumina substrate 16, the metallic layer 34 is bonded to the alumina substrate 16 with high bonding strength.

In the composite substrate 30, the brazing filler layer 24 formed by printing on the metalizing layer 18 has a sufficiently great thickness enabling the formation of the silver-copper alloy layer 34c on one surface of the metalizing layer 18 distant from the alumina substrate 16. Therefore, the formation of the metallic layers 34, 34 each constituted by the tungsten and the silver-copper alloy and the bonding of the copper sheets 26, 28 are simultaneously effected by heating with the copper sheets 26, 28 being placed, and with a suitable load being applied to the copper sheets 26, 28, after the brazing filler layers 24, 24 have been formed, dried, and degreased on the aluminum substrate 16.

In the present embodiment, the metallic layers 34, 34 having identical structures are bonded to the opposite surfaces of the alumina substrate 16, respectively (regarding the composite substrate 30, in particular, the copper sheets 26, 28 are additionally bonded to the metallic layers 34, 34, respectively). Even if the composite substrate 30 or the coated substrate is subjected to temperature changes, the thermal stresses produced in one surface of the alumina substrate 16 are comparable to the thermal stresses produced in the other surface of the same 16, and therefore the former and latter stresses compensate for each other. Thus, the composite substrate 30 or the coated substrate exhibits higher resistance to temperature changes.

In the present embodiment, the sintered alumina substrate 16 is used as the sintered ceramic body for the composite substrate 30. Since sintered alumina has excellent mechanical properties, thermal conductivity and electrically insulating performance, the composite substrate 30 is advantageously used as a substrate for, e.g., a power semiconductor module.

Additionally, the oxygen-free copper sheets 26, 28 are used as the metallic bodies for the composite substrate 30. Since the wettability of the brazing filler with respect to the oxygen-free copper sheets 26, 28 is very good, the copper sheets 26, 28 are bonded with high strength to the sintered alumina substrate 16.

The above-described Ag/Cu brazing filler may further contain titanium (Ti). For example, a Ag/Cu/Ti brazing filler paste containing 95% by weight of the above-described Ag/Cu brazing filler powder and 5% by weight of titanium powder (with, e.g., a 15 µm AGS), is prepared in the same manner as described above for the Ag/Cu brazing filler paste. The thus prepared paste is used for producing substrates similar to the composite substrate 30 and the coated substrate, in the same manner as described above for the composite substrate 30 or the coated substrate except that the Ag/Cu/Ti brazing filler paste is heated under a $1 \times 10^{-5}$ torr vacuum at 850° C. for 20 minutes. The thus produced substrates were evaluated by the same methods as described above, and the obtained results show that the bonding strengths of those substrates are about 20 kg/cm and the thermal-shock resistances of the same are very good free from cracks or peeling after having been subjected to 500 thermal-shock cycles.

There will be described another embodiment of the present invention.

An aluminum nitride-based material is prepared using 96% by weight of aluminum nitride AlN, 4% by weight of yttrium oxide $Y_2O_3$, and traces of inevitable impurities. Like in the above-described first embodiment, the aluminum nitride-based material is used for forming a green aluminum nitride sheet having, e.g., a 0.80 mm thickness. Meanwhile, four tungsten-based materials are prepared using 90% by weight of four kinds of tungsten powders (each with, e.g., a 99.9% purity) respectively having a 1.0 µm, 2.3 µm, 2.7 µm, and 3.4 µm AGS, each together with 10% by weight of an aluminum nitride-based material having the same composition as that of the above-described aluminum nitride-based material used for forming the green aluminum nitride sheet. Like in the first embodiment, the four tungsten-based materials are used for preparing four tungsten-based pastes, D (AGS; 1.0 µm), E (AGS; 2.3 µm), F (AGS; 2.7 µm), and G (AGS; 3.4 µm).

Subsequently, the green aluminum nitride sheet is cut by, e.g., blanking into several green sheets or substrates each having 64×62 mm dimensions. Like in the first embodiment, the four tungsten-based pastes D, E, F, G are used one by one in this order for forming, by printing, four green sub-layers on one another, on each of opposite major surfaces of each of the green substrates. Green composite bodies each constituted by a green aluminum nitride substrate and four green tungsten sub-layers are fired in a $N_2/H_2$ mixture gas atmosphere at 1,750° C. Thus, are obtained metalized substrates similar to the metalized substrates 20 shown in FIG. 4 except that each of the metalizing layers of the former consists of the four sub-layers whereas each of the metalizing layers of the latter consists of the three sub-layers. After each of the metalized substrates is nickel-plated, a Ag/Cu/Ti brazing filler paste is used for forming, by printing, a brazing filler layer on each of the metalizing layers of each of the metalized substrates, and subsequently the brazing filler layers are degreased, like in the first embodiment. Two oxygen-free copper sheets are respectively placed on opposite major faces of each of some of the metalized substrates, and a 0.4 g/mm² load is applied to the copper sheets. The metalized substrates with the copper sheets are heated together with the remaining metalized substrates without copper sheets, under a $1 \times 10^{-5}$ torr vacuum at 850° C. for 20 minutes. Thus, are produced aluminum nitride-based composite substrates and coated substrates similar to the substrates shown in FIGS. 5 and 6.

The bonding strengths and thermal-shock resistances of the above two kinds of substrates are measured by the same methods as used in the first embodiment. The measured bonding strengths were 18 kg/cm, and the observed thermal-shock resistances were such that the substrates were free from cracks or peeling after 500 thermal-shock cycles. At the same time, comparative aluminum nitride composite substrates produced by the previously-described conventional method were evaluated like in the first embodiment. The measured bonding strengths were 11 kg/cm, and the observed thermal-shock resistances were such that cracks were generated after 50 thermal-shock cycles. Thus, in the present embodiment, too, the composite substrate or coated substrate enjoys improved properties as compared with the substrates produced by the conventional method.

Like in the first embodiment, the substrates produced in the present embodiment have the characteristic that the ratio of the percentage content of the silver-copper alloy to that of the tungsten in each metallic layer increases with distances from the sintered aluminum nitride substrate. Thus, the substrates do not suffer from significant thermal stresses, i.e., exhibit high resistance to temperature changes, and additionally exhibit high bonding strength. Since the composite or coated substrate produced in the present embodiment has similar structures on both sides of the aluminum nitride substrate, the composite or coated substrate enjoys higher thermal resistance and bonding strength. Furthermore, each of the metallic layers produced in the present embodiment is constituted by four sub-layers, which are more advantageous in reducing the thermal stresses than the three sub-layers of each metallic layer produced in the first embodiment.

In the present embodiment, the sintered aluminum nitride substrate is used as the sintered ceramic body. Sintered aluminum nitride has higher thermal conductivity and thermal resistance than sintered alumina. Therefore, the composite or coated substrate produced in the present embodiment is more advantageously used as a substrate for a power semiconductor module.

Like in the first embodiment, the above-described structure of each metallic layer is easily produced in the present embodiment, and the bonding of the copper sheets can be effected simultaneously with the formation of the metallic layers. The oxygen-free copper sheets used in the present embodiment provide the same advantages as previously described in the first embodiment.

There will be described another embodiment of the present invention.

Three molybdenum-based materials are prepared using 85% by weight of three kinds of molybdenum powders respectively having a 1.0 μm, 1.8 μm, and 2.5 μm AGS, each together with 13% by weight of manganese dioxide ($MnO_2$), and 2% by weight of titanium dioxide ($TiO_2$). Like in the first embodiment, the three molybdenum-based materials are used for preparing three molybdenum-based pastes, H (AGS; 1.0 μm), I (AGS; 1.8 μm), and J (AGS; 2.5 μm). The three molybdenum-based pastes H, I, and J are used one by one in this order for forming, by printing and subsequent drying at 120° C., three sub-layers each with, e.g., an about 30 μm thickness on one another, on one of opposite major surfaces of a 50×50 mm sintered alumina sheet with a 10 mm thickness which is produced by firing at a suitable temperature after having been formed of an alumina powder with a 94% $Al_2O_3$ purity, e.g., by powder-compression molding. A composite body consisting of the sintered alumina sheet and the three green molybdenum sub-layers is fired in a $N_2/H_2$ mixture gas atmosphere at 1,500° C. Thus, a metalizing layer consisting of the three sintered molybdenum sub-layers is formed on the sintered alumina body.

The above metalizing layer has a structure similar to that of the metalizing layer 18 produced in the first embodiment, and BAg-8 in the form of a brazing filler sheet with a 50 μm thickness is placed on the metalizing layer. BAg-8 is a brazing filler composition consisting of silver and copper according to Japanese Industrial Standard. Additionally an oxygen-free copper sheet with a 500 μm thickness is placed on the brazing filler sheet. A 0.5 g/mm² load is applied via a spacer member to the copper sheet. The thus obtained composite body is heated under a 1×10⁻⁵ torr vacuum at 850° C. for 20 minutes. Thus, a composite body is obtained. The shearing strength of the composite body was measured, and the measured value was 15 kg/mm². Additionally, the thermal-shock resistance of the composite body was evaluated like in the first embodiment, and no crack or peeling was observed after 500 thermal-shock cycles. Simultaneously, a comparative composite body produced by the conventional method was evaluated. The measured shearing strength was 9 kg/mm² and cracks were observed after 50 thermal-shock cycles. Thus, the composite body produced in the present embodiment enjoys improved properties as compared with the composite body produced by the conventional bonding method.

In the present embodiment, too, the metallic layer serving for bonding the sintered alumina sheet and the copper sheet to each other has the characteristic that the ratio of the percentage content of the silver-copper alloy to that of the molybdenum in the metallic layer increases with distances from the sintered alumina sheet. Thus, the composite body does not suffer from significant thermal stresses, i.e., exhibits high resistance to temperature changes, and additionally exhibits high bonding strength.

Like in the first embodiment, the metallic layer whose porosity increases with distances from the sintered alumina sheet is easily produced. More easily than in the first embodiment, the bonding of the copper sheet can be effected simultaneously with the formation of the metallic layer in the manner that the brazing filler sheet and the copper sheet are placed on the metallic layer in this order and a suitable load is applied onto the copper sheet before the heat treatment.

Meanwhile, a nickel (Ni) layer may be provided at the interface between a metal having a high melting point and a silver/copper-based alloy. In each of the preceding, first to third embodiments, the metalized surface of a metalized substrate such as the metalized substrate 20 shown in FIG. 4 may be subjected to electroless nickel plating so as to form a nickel layer on the pore-defining internal surfaces of the metalizing sub-layers 18b, 18c each essentially formed of a high melting point such as tungsten or molybdenum. Subsequently, in the same manner as described in each of the first to third embodiments, composite substrates or bodies are produced.

The nickel layer provided by plating on the pore-defining internal surfaces of the metalizing layer 18 before the brazing filler is impregnated into the pores of the metalizing layer 18, improves the wettability of the silver/copper-based alloy with respect to the tungsten or molybdenum. Therefore, the silver-copper alloy is impregnated down to the low-porosity portion of the metalizing layer 18 near the sintered ceramic substrate such as the alumina substrate 16, and the silver-copper alloy is bonded with high strength to the tungsten or molybdenum. Thus, the metallic layer 34 provides a considerably dense layer as a whole and exhibits high thermal conductivity.

There will be described another embodiment of the present invention.

A mullite-based powder consisting of, e.g., 99.5% by weight of mullite and 0.5% by weight of magnesium oxide MgO is used for forming a green mullite sheet with a 0.8 mm thickness, in the same manner as described in the first embodiment. Meanwhile, three kinds of tungsten-based powders are prepared using 90% by weight of three kinds of tungsten powders respectively having, e.g., a 1.2 μm, 2.6 μm, and 3.1 μm AGS, each together with 10% by weight of a mullite-based powder having the same composition as that of the mullite-based powder used for forming the green mullite sheet. Like in the first embodiment, the three tungsten-based mixture powders are used for preparing three tungsten-based pastes, K (AGS; 1.2 μm), L (AGS; 2.6 μm), and M (AGS; 3.1 μm).

The green mullite sheet is cut using, e.g., a cutter into several green mullite substrates each having 45×45 mm dimensions. The three tungsten-based pastes K, L, and M are used one by one in this order for forming, by printing, three green tungsten sub-layers each with a thickness of about 30 μm on one another, on each of opposite major surfaces of each of the green mullite substrates. The thus obtained green composite bodies each constituted by a green mullite sheet and three green tungsten sub-layers are fired in a $N_2/H_2$ mixture gas atmosphere at 1,630° C. Thus, are obtained metalized substrates similar to the metalized substrates 20 shown in FIG. 4. The previously-described Ag/Cu/Ti brazing filler paste is used for forming, by printing, a brazing filler layer on each of the metalizing layers of each of the metalized substrates. Subsequently, the brazing filler layers are degreased. Oxygen-free copper sheets each with a 250 μm thickness are placed on each of the brazing filler layers of each of some of the metalized substrates, and a 0.3 g/mm² load is applied via spacer members to the copper sheets. The metalized substrates with the copper sheets are heated together with the remaining metalized substrates without copper sheets, under a 1×10$^{-5}$ torr vacuum at 850° C. for 20 minutes. Thus, are produced mullite-based composite substrates and coated substrates similar to the substrates shown in FIGS. 5 and 6.

The above two kinds of substrates were evaluated with respect to bonding strength and thermal-shock resistance, by using the same methods as used in the first embodiment. The measured bonding strengths were 18 kg/cm, and the thermal-shock resistances were such that no crack or peeling was observed in the substrates after 500 thermal-shock cycles.

For the same reasons as described above in the preceding embodiments, the substrates produced in the present embodiment do not suffer from significant thermal stresses, i.e., exhibit high resistance to temperature changes, and additionally exhibit high bonding strength.

In the present embodiment, the sintered mullite substrate is used as the sintered ceramic body. Since sintered mullite has a lower dielectric constant than that of alumina or aluminum nitride, it is more advantageously used for forming substrates, since apparent signal delay is shortened on those substrates.

There will be described another embodiment of the present invention.

A silicon nitride-based material is prepared using, for example, 92% by weight of silicon nitride $Si_3N_4$, 3% by weight of alumina $Al_2O_3$, 2% by weight of yttrium oxide $Y_2O_3$, and traces of inevitable impurities. The silicon nitride-based material is mixed with an acrylic resin-type forming aid so as to provide a silicon nitride-based slurry, which in turn is granulated and powdered using a spray drier. After the thus obtained powder is pre-formed into a suitable shape using, e.g., a hydraulic forming machine, the obtained pre-formed body is subjected to isostatic forming under a 2 ton/cm$^2$ pressure so as to produce a cylindrical formed body with a 15 mm diameter and a 50 mm length. Meanwhile, three kinds of tungsten-based materials are prepared by using 75% by weight of tungsten powder having a 1.1 μm AGS and 25% by weight of a silicon nitride-based powder having the same composition as that of the above-described silicon nitride material used for forming the green silicon nitride sheet, and by using 90% by weight of two kinds of tungsten powders respectively having a 2.5 μm and a 3.3 μm AGS, each together with 10% by weight of the same silicon nitride-based powder. The thus obtained three tungsten-based mixture powders are used in the same manner as described in the first embodiment, for providing three tungsten-based pastes, N (AGS; 1.1 μm), O (AGS; 2.5 μm), and P (AGS; 3.3 μm).

Subsequently, like in the first embodiment, the three tungsten-based pastes N, O, and P are used one by one in this order for forming or laminating, by printing, three green tungsten sub-layers each with an about 30 μm thickness, on one of axially opposite end faces of the above-described cylindrical formed body. A green composite body constituted by a cylindrical formed body and three green sub-layers is fired in a 4 atm, $N_2$ gas environment at 1,750° C. Thus, is obtained a sintered silicon nitride body having, on one end face thereof, a metalizing layer similar to the metalizing layer 18 produced in the first embodiment. A BAg-8 brazing filler foil having a 50 μm thickness and containing 0.3% by weight of lithium (Li) is placed on the metalizing layer of the sintered silicon nitride body. An oxygen-free copper sheet having a 500 μm thickness is placed on the brazing filler foil, a 0.3 g/mm$^2$ is applied via a spacer member to the copper plate, and the thus obtained composite structure is heated under a 1×10$^{-5}$ torr vacuum at 850° C. for 15 minutes. Thus, is produced the composite structure wherein the copper sheet is bonded to one end face of the sintered silicon nitride body.

The above composite structure was evaluated with respect to bonding strength (i.e., shearing strength) and thermal-shock resistance. The measured shearing strength was 15 kg/mm$^2$, and the measured thermal-shock resistance was such that no crack or peeling was observed in the composite structure after 100 thermal-shock cycles.

For the same reasons as described above in the preceding embodiments, the composite structure produced in the present embodiment does not suffer from significant thermal stresses, i.e., exhibits high resistance to temperature changes, and additionally exhibits high bonding strength.

In the present embodiment, the sintered silicon nitride body is used as the sintered ceramic body. Sintered silicon nitride has a flexural strength greater about 50 to 100%, and a fracture toughness greater about 100 to 200%, than even the strength and toughness of alumina that are relatively high among various substrate materials. Thus, the present composite structure enjoys, in particular, high thermal-shock resistance. For example, a comparative article constituted by an alumina body and a copper sheet bonded thereto and having a shape similar to that of the composite structure produced in the present embodiment, is obtained in the same manner as used in the present embodiment except that a titanium foil with a 10 μm thickness is interposed between the brazing filler foil and the copper sheet. The thermal-shock resistance of the comparative article was evaluated in the same manner as described above, and cracks were observed after about 10 thermal-shock cycles. In contrast thereto, the composite structure produced in the present embodiment was free from cracks or peeling even after 100 thermal-shock cycles, as described above. That is, the silicon nitride-based composite structure enjoys a higher thermal-shock resistance than the comparative article wherein the titanium foil is used for enhancing the bonding strength of the copper sheet and the alumina body. Thus, the silicon nitride-based composite structure is particularly suitable for use under frequent temperature changes.

Hereinafter, there will be described other embodiments of the present invention in which copper is used as the copper or silver/copper-based alloy impregnated into the metalizing layer or layers.

Figure 7:
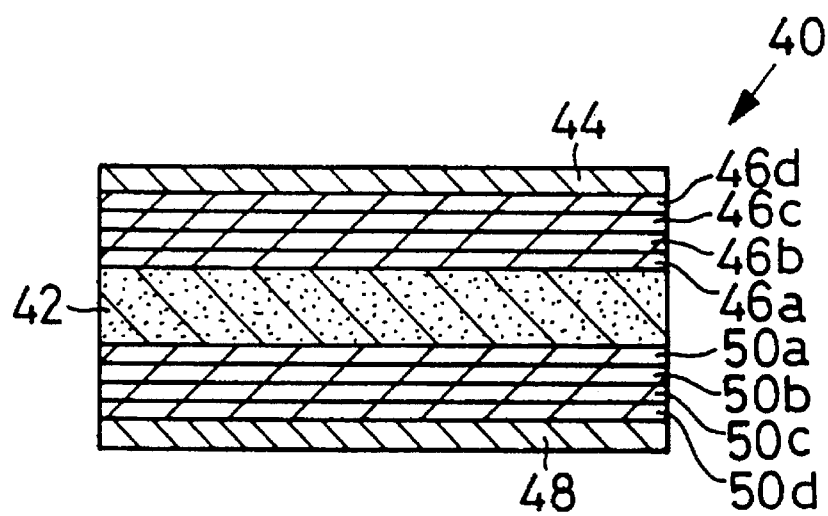
FIG. 7 is an illustrative enlarged cross-sectional view of a ceramic-metal composite structure as another embodiment of the present invention.

FIG. 7 is an enlarged, illustrative view of the cross-sectional structure of a coated substrate 40 produced in one embodiment of the present invention. The coated substrate 40 is constituted by a ceramic substrate layer 42, two tungsten/copper mixture layers 46, 50 respectively provided on opposite major surfaces of the substrate layer 42, and two copper or copper alloy layers 44, 48 respectively provided on the two tungsten/copper mixture layers 46, 50. In the present embodiment, the two tungsten/copper mixture layers 46, 50 are constituted by four sub-layers 46a, 46b, 46c, and 46d, and four sub-layers 50a, 50b, 50c, and 50d, respectively.

In the structure of each of the tungsten/copper mixture layers 46, 50, the ratio of the percentage content of the copper to that of the tungsten (hereinafter, referred to as the "Cu to W ratio") stepwise or continuously increases with respective distances of the corresponding four sub-layers 46a, 46b, 46c, 46d or 50a, 50b, 50c, 50d from the ceramic substrate layer 42. The rate of change of the Cu to W ratio may be selected at any value. For example, the four sub-layers 46a, 46b, 46c, 46d or 50a, 50b, 50c, 50d may be so formed as to have 0, ¼, ½, and ¾ Cu to W ratios, respectively. By changing the rate of change of the Cu to W ratios, the physical properties, such as coefficient of thermal expansion, coefficient of thermal conductivity, Young's modulus, density and electric conductivity, of the tungsten/copper mixture layer 46 or 50 are changed to any values between those of the tungsten and those of the copper. In the case where a nickel layer is provided at the interface of the tungsten and the copper in the tungsten/copper mixture layer 46 or 50, the tungsten and the copper are bonded to each other with higher strength. Thanks to the above-described structure, the coated substrate 40 enjoys reduced thermal stresses at the interfaces of adjacent layers having different physical properties, in particular when being subjected to heat shocks or heat cycles. Thus, the coated substrate 40 exhibits excellent durability and reliability.

Figure 8:
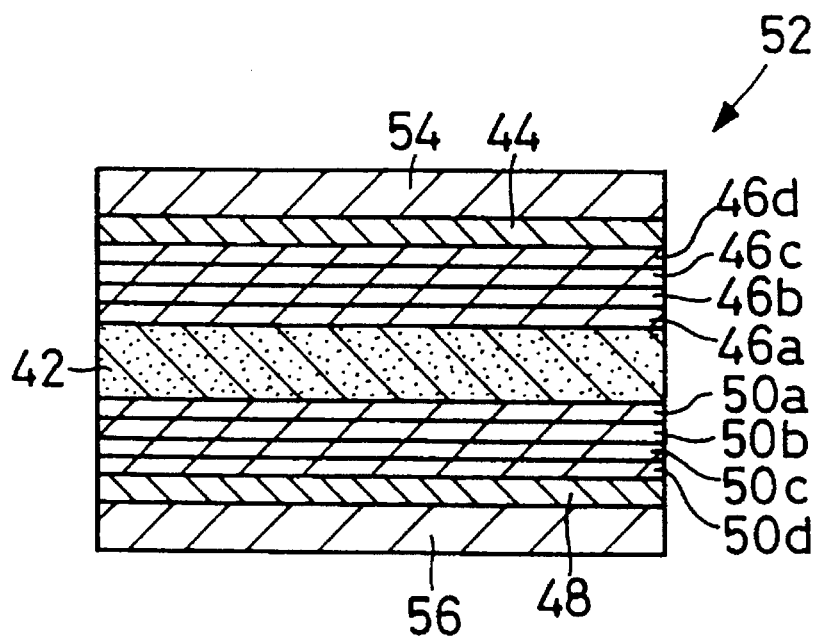
FIG. 8 is an illustrative enlarged cross-sectional view of a ceramic-metal composite structure as yet another embodiment of the present invention.

FIG. 8 is an enlarged, illustrative view of the cross-sectional structure of a composite substrate 52 produced in another embodiment of the present invention. The composite substrate 52 is produced by bonding two metallic sheets 54, 56 onto respective top sub-layers 46d, 50d of two tungsten/copper mixture layers 46, 50 of a substrate having the same structure as that of the coated substrate 40 shown in FIG. 7. The metallic sheets 54, 56 are preferably formed of copper, or an alloy containing copper as an essential constituent thereof. The bonding of the metallic sheets 54, 56 may be effected either concurrently with the formation of copper or copper alloy layers 44, 48 respectively on the top tungsten sub-layers 46d and 50d, or by using a Ag/Cu/Ti activated brazing filler.

There will be described a method of producing the coated substrate 40 or the composite substrate 52.

Four tungsten-based materials are prepared using 90% by weight of four kinds of tungsten powders (each with, e.g., a not less than 99.9% purity) respectively having a 1.0 μm, 1.8 μm, 2.4 μm, and 3.0 μm AGS, each together with 10% by weight of an alumina-based powder having the same composition as that of an alumina-based powder (consisting of 94% by weight of alumina and 6% by weight of CaO, MgO, and $SiO_2$) used for forming a green alumina sheet described below. Each of the four tungsten-based materials is mixed with a vehicle containing terpineol and ethyl cellulose, and then each of the thus-obtained four mixtures is kneaded using a three-roll mill. In this way, four tungsten-based pastes, Q (AGS; 1.0 μm), R (AGS; 1.8 μm), S (AGS; 2.4 μm), and T (AGS; 3.0 μm) are obtained. Meanwhile, an alumina-based powder consisting 94% by weight of alumina powder and 6% by weight of sintering aids (CaO, MgO, $SiO_2$) is mixed with a methacrylate resin. This mixture is formed, by the doctor blade method, into a green alumina sheet having a 0.8 mm thickness which in turn is cut into a 45×45 mm sheet.

The four tungsten pastes Q, R, S, and T are used one by one in this order for forming, by printing, four sub-layers each with an about 40 μm thickness on one another, on each of upper and lower surfaces of the above-described 45×45 mm green alumina sheet. Each green sub-layer is dried at 80° C. before another sub-layer is formed thereon. The green alumina sheet with the four green tungsten sub-layers is fired in a $N_2/H_2$ mixture gas at 1,600° C. Thus, is obtained a structure which has, on each of the opposite surfaces of the sintered alumina substrate, the four tungsten sub-layers the top three layers of which provide three porous layers whose porosities stepwise increase with distances thereof from the alumina substrate.

A copper-based paste prepared by mixing a copper powder (with, e.g., a 3 μm AGS) with a vehicle and kneading the obtained mixture using a three-roll mill, is used for forming, by printing, a copper layer with a 30 μm thickness on each of the respective top tungsten sub-layers in the opposite faces of the structure. The structure with the two copper layers is heated in an inert gas at 1150° C. Thus, is obtained a structure similar to the above-described coated substrate 40, in which the copper is impregnated into the pores of the top three tungsten sub-layers so as to provide three tungsten/copper mixture layers whose copper contents stepwise increase with distances thereof from the alumina substrate.

There will be described another production method.

Four tungsten-based materials are prepared using 90% by weight of four kinds of tungsten powders (each with, e.g., a not less than 99.9% purity) respectively having a 1.0 μm, 1.8 μm, 2.4 μm, and 3.0 μm AGS, each together with 10% by weight of an aluminum nitride-based powder having the same composition as that of an aluminum nitride-based powder (consisting of, e.g., 96% by weight of AlN and 4% by weight of $Y_2O_3$) used for forming a green aluminum nitride sheet described below. Each of the four tungsten-based materials is mixed with a vehicle containing terpineol and ethyl cellulose, and then each of the thus obtained four mixtures is kneaded using a three-roll mill. In this way, four tungsten-based pastes, V (AGS; 1.0 μm), W (AGS; 1.8 μm), X (AGS; 2.4 μm), and Y (AGS; 3.0 μm) are obtained. Meanwhile, an aluminum nitride-based powder consisting of 96% by weight of AlN powder (with, e.g., a 1.9 μm AGS) and 4% by weight of yttrium oxide $Y_2O_3$ (with, e.g., a 1.2 μm AGS) is mixed with a methacrylate resin. This mixture is formed, by the doctor blade method, into a green aluminum nitride sheet having a 0.8 mm thickness which in turn is cut into a 45×45 mm sheet.

The four tungsten-based pastes V, W, X, and Y are used one by one in this order for forming, by printing, four green tungsten sub-layers each with an about 40 μm thickness on each of upper and lower surfaces of the above-described 45×45 green aluminum nitride sheet. Each green sub-layer is dried at 80° C. before another sub-layer is formed thereon. The green aluminum nitride sheet with the four green tungsten sub-layers in each face thereof is fired in a $N_2/H_2$ mixture gas at 1,750° C. Thus, is obtained a structure which has, on each of the opposite surfaces of the sintered aluminum nitride substrate, the four tungsten sub-layers the top three layers of which provide three porous layers whose porosities stepwise increase with distances thereof from the aluminum nitride substrate.

A copper-based paste prepared by mixing a copper powder (with, e.g., a 3 μm AGS) with a vehicle and kneading the obtained mixture using a three-roll mill, is used for forming, by printing, a copper layer with a 30 μm thickness on each of the respective top tungsten sub-layers in the opposite faces of the structure. The structure with the two copper layers is heated in an inert gas at 1,150° C. Thus, is obtained a structure similar to the above-described coated substrate 40, in which the copper is impregnated into the pores of the top three tungsten sub-layers so as to provide three tungsten/copper mixture layers whose copper contents stepwise increase with distances thereof from the aluminum nitride substrate.

There will be described a method of bonding a metallic body to a structure produced by the above-described first or second production method.

A Ag/Cu/Ti mixture powder is prepared by grinding and mixing, using an attritor, 72% by weight of silver powder (with, e.g., a 1.5 μm AGS), 2% by weight of titanium powder (with, e.g., a 20 μm AGS), and 26% by weight of copper powder (with, e.g., a 1.5 μm AGS). The mixture powder is mixed with a vehicle containing ethyl cellulose and terpineol, and then this mixture is kneaded using a three-roll mill. Thus, a Ag/Cu/Ti activated brazing filler is obtained. The brazing filler is used for forming, by printing, a brazing filler layer on each of opposite major faces of a substrate similar to the coated substrate 40 produced in one preceding embodiment, and a copper sheet with a 0.2 mm thickness is placed on each of the brazing filler layers. The bonding of the copper sheets to the structure is carried out under vacuum at 900° C. Thus, is obtained a composite structure similar to the above-described composite substrate 52.

There will be described another production method.

Each of three kinds of tungsten powders (each with, e.g., a not less than 99.9% purity) respectively having a 1.5 μm, 2.1 μm, and 3.0 μm AGS, is mixed with a methacrylate resin. The thus obtained three kinds of mixtures are respectively formed, by the doctor blade method, into three green tungsten sheets, a, b, and c, each with a 200 μm thickness. The above-described tungsten-based paste Q is used for forming by printing a tungsten layer with a 30 μm thickness on each of opposite surfaces of a 45×45 green alumina sheet (with, e.g., a 0.8 mm thickness) prepared in the above-described first production method, and subsequently the tungsten layers are dried. Then, the three green tungsten sheets a, b, c are superposed in this order on each of the respective printed tungsten layers on the upper and lower surfaces of the green alumina sheet, and are subjected to thermocompression bonding. The green alumina sheet with the tungsten layer and sheets is fired in a $N_2/H_2$ mixture gas at 1,600° C. Thus, is obtained a structure which has, on each of the opposite surfaces of the sintered alumina substrate, the four tungsten layers the top three layers of which provide three porous layers whose porosities stepwise increase with distances thereof from the alumina substrate.

A copper-based paste prepared by mixing a copper powder (with, e.g., a 3 μm AGS) with a vehicle and kneading the obtained mixture using a three-roll mill, is used for forming, by printing, a copper layer with a 30 μm thickness on each of the respective top tungsten layers in the opposite faces of the structure. The structure with the copper layers is heated in an inert gas at 1,150° C. Thus, is obtained a structure similar to the above-described coated substrate 40, in which the copper is impregnated into the pores of the top three tungsten layers so as to provide three tungsten/copper mixture layers whose copper contents stepwise increase with distances thereof from the alumina substrate.

There will be described another production method.

Four tungsten-based materials are prepared using 90% by weight of four kinds of tungsten powders (each with, e.g., a not less than 99.9% purity) respectively having a 1.0 μm, 1.8 μm, 2.4 μm, and 3.0 μm AGS, each together with 10% by weight of an alumina-based powder having the same composition as that of an alumina-based powder (consisting of, e.g., 94% by weight of alumina and 6% by weight of CaO, MgO, SiO$_2$) used for forming a green alumina sheet described below. Each of the four tungsten-based materials is mixed with a vehicle containing terpineol and ethyl cellulose, and then each of the obtained four mixtures is kneaded using a three-roll mill. In this way, four tungsten-based pastes, Q (AGS; 1.0 μm), R (AGS; 1.8 μm), S (AGS; 2.4 μm), and T (AGS; 3.0 μm) are obtained. Meanwhile, an alumina-based powder consisting of 94% by weight of alumina powder and 6% by weight of sintering aids (CaO, MgO, SiO$_2$), is mixed with a methacrylate resin. This mixture is formed, by the doctor blade method, into a green alumina sheet having a 0.8 mm thickness which in turn is cut into a 45×45 mm sheet.

The four tungsten pastes Q, R, S, and T are used one by one in this order for forming or laminating, by printing, four green tungsten sub-layers each with an about 40 μm thickness on each of upper and lower surfaces of the above-described 45×45 mm green alumina sheet. Each green sub-layer is dried at 80° C. before another sub-layer is formed thereon. The green alumina sheet with the four tungsten green sub-layers on each face thereof is fired in a $N_2/H_2$ mixture gas at 1,600° C. Thus, is obtained a structure which has, on each of the opposite surfaces of the sintered alumina substrate, the four tungsten sub-layers the top three layers of which provide three porous layers whose porosities stepwise increase with distances thereof from the alumina substrate.

Electroless nickel plating is carried out so as to form a nickel layer on each of the respective top tungsten sub-layers in the opposite faces of the structure. A copper-based paste prepared by mixing a copper powder (with, e.g., a 3 μm AGS) with a vehicle and kneading the obtained mixture using a three-roll mill, is used for forming, by printing, a copper layer with a 30 μm thickness on each of the respective top sub-layers of the two tungsten layers provided in the opposite faces of the structure. The structure with the copper layers is heated in an inert gas at 1,150° C. Thus, is obtained a structure in which the copper is impregnated into the pores of the top three tungsten sub-layers so as to provide three tungsten/copper mixture layers whose copper contents stepwise increase with distances thereof from the alumina substrate. Additionally, the nickel layer provided at the interface of the tungsten and the copper, serves for holding the two metals with greater force.

In order to compare the properties of the above-described composite substrate 52 with a comparative substrate with a copper member bonded thereto by a conventional method, the following tests were carried out.

A Ag/Cu/Ti mixture powder is prepared by grinding and mixing, using an attritor, 72% by weight of silver powder (with, e.g., a 1.5 μm AGS), 2% by weight of titanium powder (with, e.g., a 20 μm AGS), and 26% by weight of copper powder (with, e.g., a 1.5 μm AGS). The mixture powder is mixed with a vehicle containing ethyl cellulose and terpineol, and then this mixture is kneaded using a three-roll mill. Thus, a Ag/Cu/Ti activated brazing filler paste is obtained. The brazing filler paste is used for forming, by printing, a brazing filler layer on each of opposite major surfaces of a 36×36 mm sintered alumina substrate with a 0.635 mm thickness, and a copper sheet with a 0.2 mm thickness is placed on each of the brazing filler layers. The bonding of the copper sheets to the substrate is effected under vacuum at 900° C. The thus obtained substrate is used as a comparative substrate with a bonded copper member.

Meanwhile, the composite substrate 52 is produced by the above-described method so as to have the same dimensions as those of the comparative substrate. The composite substrate 52 and the comparative substrate are put in a thermal-shock tester. The thermal-shock test was effected by repeating a thermal-shock temperature change cycle consisting of a series of steps in which each substrate is cooled to and held at −55° C. for 30 minutes and then heated to and held at 150° C. The control of temperatures in the thermal-shock tester was carried out by cooling or heating a taken ambient air and sending the cooled or heated air into the tester in which the test articles are placed. No crack was observed in the composite substrate 52 in accordance with the present invention even after 500 thermal-shock cycles, whereas cracks were observed in the comparative substrate (specifically, in the alumina substrate) after 50 thermal-shock cycles.

Figure 9:
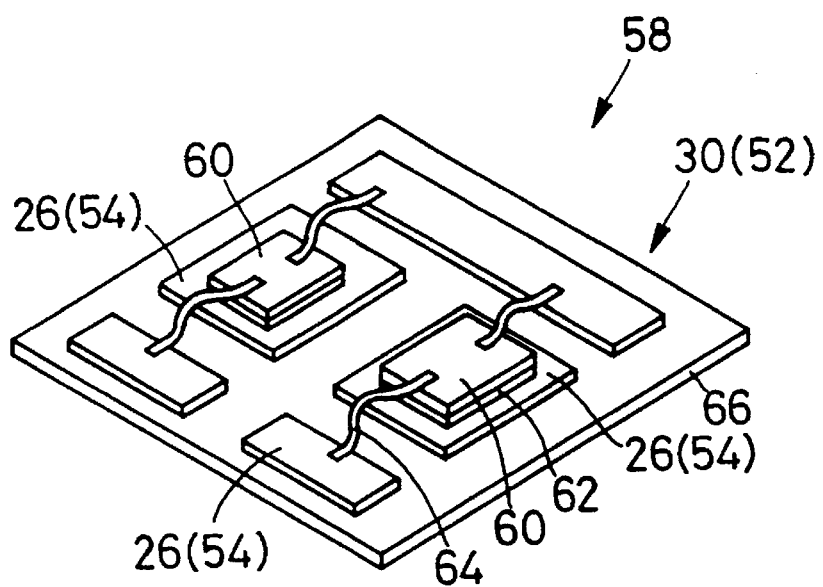
FIG. 9 is a perspective view of a composite substrate in accordance with the present invention as applied to a power semiconductor module.

FIG. 9 is an illustrative view of the composite substrate 30, 52, etc. in accordance with the present invention which substrate is applied to a power semiconductor module 58. Semiconductor elements 60, 60 are bonded via respective solder layers 62 to appropriate parts of the copper sheet 26 or 54 formed in the form of a circuit pattern on one major surface of the composite substrate 30, 52. The semiconductor elements 60 are connected via wiring 64 to other parts of the copper sheet 26, 54. The composite substrate 30, 52 applied to the power semiconductor module 58 has another copper sheet 28, 56 serving as a heat radiating member as previously described (cf. FIGS. 5 and 8), in one face of a ceramic substrate 66 opposite to the other face thereof to which the semiconductor elements 60 are bonded. Thus, the copper plate 28, 56 effectively radiates the heat generated by the semiconductor elements 60. Therefore, the power semiconductor module 58 enjoys excellent thermal-shock resistance, durability, and reliability. The ceramic substrate 66 may be either the alumina or aluminum nitride substrate as described in the preceding embodiments. In FIG. 9, metallic layers 34 or tungsten/copper mixture layers 46 are not shown for simplicity purposes only.

Figure 10:
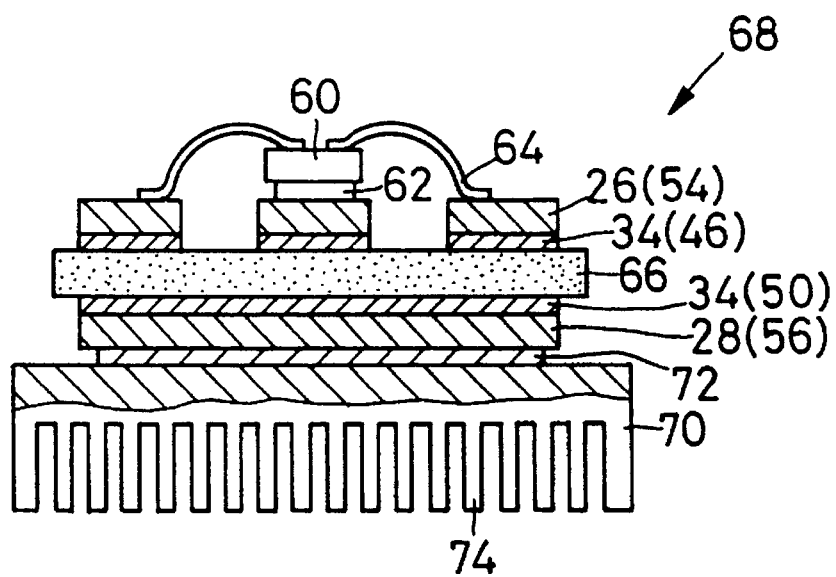
FIG. 10 is a perspective view of a composite substrate in accordance with the present invention as applied to another power semiconductor module.

FIG. 10 is an illustrative cross-sectional view of the composite substrate 30, 52, etc. in accordance with the present invention which substrate is applied to another power semiconductor module 68. The semiconductor module 68 has, in one face of a ceramic substrate 66 on which semiconductor elements 60 are provided, a structure similar to that of the above-described semiconductor module 58, therefore the description of that structure is omitted. A copper sheet 28, 56 is bonded, via a metallic layer 34 or a tungsten/copper mixture layer 50, to the other face of the ceramic substrate 66, and additionally a heat sink 70 is bonded to the copper sheet 28, 56 via a solder layer 72. The heat generated by the semiconductors 60 is more efficiently radiated from the semiconductor module 68 than the semiconductor module 58. The heat sink 70 includes a number of fins 74 opposite to the solder layer 72, for increasing the all surface area and thereby improving the efficiency of heat radiation. In the present embodiment, the copper sheet 28, 56 does not serve as a heat radiating member, but serves as a conductor constituting a part of a circuit.

While the present invention has been described in its embodiments, the invention may otherwise be embodied.

In the illustrated embodiments, the sintered ceramic body is produced using alumina, aluminum nitride, mullite, or silicon nitride. Other ceramic materials such as zirconia, magnesia, boron nitride, silicon carbide, aluminum nitride oxide, boron carbide, and zirconium boride may be used for producing the sintered ceramic body. The sintered ceramic body may contain sintering aids in addition to inevitable impurities. Other than described in the illustrated embodiments, sintering aids such as yttrium oxide $Y_2O_3$, barium oxide BaO, and chromium oxide $Cr_2O_3$ may be used with alumina, and sintering aids such as calcium oxide CaO, barium oxide BaO, strontium oxide SrO, calcium carbonate $CaCO_3$, barium carbonate $BaCO_3$, strontium carbonate $SrCO_3$, calcium aluminate $CaAl_2O_4$, lanthanum oxide $La_2O_3$, and cerium dioxide $CeO_2$ may be used with aluminum nitride. The sintered ceramic body may be formed, depending upon its applications, with various shapes such as a prismatic shape other than the sheet-like or cylindrical shape described in the illustrated embodiments. The manner of formation of the sintered ceramic body may be selected from isotropic compression molding, extrusion molding, pouring molding, injection molding, etc. Since only small thermal stresses are generated in the sintered ceramic body provided in the producing method in accordance with the present invention, a metallic member may be bonded with high reliability to a sintered ceramic body having a considerably low mechanical strength.

Tungsten (W), Molybdenum (Mo), etc. each having a low coefficient of thermal expansion are preferably used as a metal having a high melting point. The high-melting-point metal may be mixed with an appropriate amount or amounts of one or more additives selected from oxides of those metals; ceramic materials having the same compositions as those of the ceramic materials used for producing the sintered ceramic bodies; manganese; titanium; and rhenium Re. For example, high-melting-point metals mixed with the same ceramic materials as used for producing those sintered ceramic bodies which contain alumina, aluminum nitride, silicon nitride, or mullite, are selected from the following compositions: W—$Al_2O_3$, W—$Al_2O_3$—$SiO_2$—MgO-CaO, W—AlN, W—AlN—$Y_2O_3$, W—AlN—CaO, W—$Si_3N_4$, W—$Si_3N_4$—$Y_2O_3$—$Al_2O_3$, W—$Al_2O_3$—$SiO_2$, and W—$Al_2O_3$—$SiO_2$—MgO. In these high-melting-point metal mixtures, W may be replaced with W mixed with $WO_3$, with Mo, or with Mo mixed with $MoO_3$. Other preferred examples of the high-melting-point metal mixtures containing various additives are as follows: Mo—Mn, Mo—Mn—Ti, Mo—$SiO_2$, Mo—$MoO_2$—$TiO_2$, $MoO_3$—$MnO_2$—$TiO_2$—$SiO_2$, W—$MnO_2$—$TiO_2$—$SiO_2$, and W—Re—$MnO_2$—$TiO_2$. One or more additives to be added and the amount or amounts thereof are determined taking into consideration the desired bonding strength of the sintered ceramic body and the high-melting-point metal, desired coefficients of thermal conductivity and thermal expansion of the metallic layer, etc. It is preferred that the amount or summed amounts of the additive or additives do not exceed 30% by weight, more advantageously about 10% by weight, so that the coefficients of thermal conductivity and thermal expansion, etc. of the metallic layer fall within respective appropriate ranges. In the illustrated embodiments, the high-melting-point metal layer whose porosity stepwise or continuously changes therein, is produced by using two or more kinds of high-melting-point-metal-based powders having different particle sizes. Otherwise, the above high-melting-point metal layer may be produced by changing the additive or additives and/or amount or amounts thereof contained therein and thereby controlling the sinterbility thereof.

As described in the illustrated embodiments, the high-melting-point metal layer may be formed either by the method (wet method) in which the metal layer is fired simultaneously with the formed green ceramic body, or by the method (dry method) in which the metal layer is fired on the sintered ceramic body. Appropriate one of the two methods is selected depending upon the particle sizes or sinterabilities of the metal powders, selected sintering aids, etc. While in some of the illustrated embodiments the high-melting-point metal sub-layers are formed by printing using the metal pastes, the metal sub-layers may otherwise be formed by, for example, laminating green sheets of an appropriate high-melting-point metal which are prepared by the same method as used for preparing the green alumina sheet in some of the illustrated embodiments, and subsequently subjecting the laminated green sheets to thermocompression bonding. Furthermore, in the case of the paste-printing method, relatively thick (not less than 50 μm) layers may be obtained by repeating printing using the same paste.

The conditions under which the high-melting-point metal layer is fired are selected depending upon the kind or nature of the formed green ceramic body on which the metal layer is formed, the nature of the high-melting-point metal, etc. The metal layer may be fired under pressure, as needed.

For reducing the thermal stresses, it is more effective to continuously change the ratio of the percentage content of the silver/copper-based alloy to that of the high-melting-point metal in the metallic layer (hereinafter, referred to simply as the "ratio" when appropriate). However, as long as the metallic layer is constituted by two or more sub-layers having different ratios (in this case, those ratios stepwise change), the metallic layer provides a satisfactory effect with respect to the reduction of the thermal stresses. A metallic layer whose ratio continuously changes therein may be produced by reducing the difference between the porosities of each pair of adjacent porous sub-layers and increasing the total number of the porous sub-layers. Meanwhile, the amount of the silver/copper-based alloy impregnated in each of the porous sub-layers is not uniform as viewed in the direction of thickness thereof because of, for example, flow resistance in each porous sub-layer. Specifically, the amount of the alloy impregnated in each porous sub-layer is small near the sintered ceramic body and is large away from the ceramic body in each porous sub-layer. For this reason, the ratios of each pair of adjacent porous sub-layers do not largely change at the interface thereof, but rather they continuously change. In the case of producing a metallic layer whose ratio stepwise changes, the metallic layer is preferably constituted by three or more porous sub-layers having different ratios, for the purpose of reducing the generation of thermal stresses. Furthermore, the top and bottom sub-layers of the metallic layer may not be constituted by the high-melting-point-metal-free sub-layer and the silver/copper-based-alloy-free sub-layer, respectively, unlike in the illustrated embodiments. The ratio of the percentage content of the silver/copper-based alloy to that of the high-melting-point metal in the metallic layer may be determined at any value depending upon desired bonding strength, coefficient of thermal expansion, etc. However, for enhancing the bonding strength of the sintered ceramic body and the metallic layer, it is preferred that the bottom sub-layer of the metallic layer be free from the silver/copper-based alloy, i.e., be a layer formed essentially of a high-melting-point metal having good wettability with respect to the ceramic body. Additionally, for enhancing the bonding strength of the metallic layer and the metallic body, it is preferred that the top sub-layer of the metallic layer be free from the high-melting-point metal, i.e., be a layer formed essentially of a silver/copper-based alloy with good solder wettability. Even in the case where the pores of the high-melting-point-metal sub-layers are not completely filled with the silver-copper type alloy impregnated therein, that is, where a certain portion of the pores remain unfilled in the metallic layer, the present invention works with good effects. According to the principle of the present invention, it is required that high-melting-point-metal-based materials including high-melting-point metal powders having different particle sizes or different sinterabilities be selected as described previously and those materials be used for laminating high-melting-point metal sub-layers having different controlled porosities which increase with respective distances of those sub-layers from the sintered ceramic body, and that the copper or silver/copper-based alloy be impregnated in the pores of those sub-layers so as to produce a metallic layer in which the ratio of the percentage content of the copper or silver/copper-based alloy to that of the high-melting-point metal stepwise or continuously increases with distances away from the sintered ceramic body. As described in the illustrated embodiments, the metallic layer may be formed on either one or each of the upper and lower surfaces of the sintered ceramic body.

As described in the illustrated embodiments, the nickel plating after the formation of the metalizing layer may be omitted in the case where the bonding strength of the metalizing layer with respect to the brazing filler is sufficiently high. However, the nickel layer formed by the nickel plating improves the wettability of the pores-defining internal surfaces of the high-melting-point-metal sub-layers which surfaces are covered with oxide films, with respect to the brazing filler, thereby enabling the adhesion of the sub-layers and the brazing filler with higher strength.

The silver/copper-based alloy is preferably formed of a composition consisting of 40 to 96% by weight of silver and 4 to 60% by weight of copper. Other than titanium described in the illustrated embodiments, up to 30% % by weight of niobium Nb, hafnium Hf, zirconium Zr, etc. may be contained in the above composition. In these cases, the same effects are produced as those obtained by the addition of titanium. Furthermore, traces of lithium Li, tin Sn, nickel Ni, indium In, etc. may be added to the above composition. In the case where the brazing filler is bonded to the metalizing layer with sufficiently high strength, any of the additive metals may not be contained in the above composition.

The heat treatment in the impregnating step is advantageously carried out under the following conditions: in an inert gas (e.g., argon Ar) atmosphere; under a not more than $1 \times 10^{-3}$ torr vacuum; in a temperature range of 650° to 950° C.; and with a 0.1 to 0.5 g/mm$^2$ load being applied. These conditions may be changed depending upon the thickness of the metallic layer, composition of the silver/copper-based alloy, etc.

The metallic body to be bonded to the sintered ceramic body is preferably selected from, other than the oxygen-free copper used in the illustrated embodiments, tough pitch copper, copper alloy, copper-plated metal, copper-cladded metal, nickel, etc. Additionally, the metallic body may be a steel sheet, stainless steel, etc. In the composite structure in accordance with the present invention, is generated only extremely reduced thermal stresses due to the difference between the thermal expansion coefficients of the sintered ceramic body and the metallic body bonded thereto. Therefore, a variety of metals other than copper that absorbs thermal stresses thanks to its malleability may be used as the metallic body bonded to the ceramic body. Additionally, it is possible to use, as the metallic body, metallic sheets having much greater area and thickness (for example, 5 mm thickness) than the upper limits, 100×100×0.5 (thickness) mm, of conventionally producible or usable metallic sheets. Therefore, in the case where the present invention is applied to, for example, a substrate of a high-power semiconductor module or which a heavy current up to 50 to 60 A is used, a considerably thick copper circuit sheet can be bonded as a desired circuit pattern to the substrate. As described in the illustrated embodiments, the metallic body may be bonded to either one or each of the upper and lower faces of the sintered ceramic body. In the case where two metallic bodies are bonded to the opposite faces of the ceramic body, respectively, comparable thermal stresses are symmetrically produced in the opposite faces of the ceramic body. This is very advantageous in improving the thermal-shock resistance of the ceramic-metal composition structure in accordance with the present invention.

It is to be understood that the present invention may be embodied with other changes or modifications without departing from the scope and spirit of the present invention.

We claim:

1. A ceramic-metal composite structure comprising:

a sintered ceramic body;

a metallic layer bonded to a surface of at least a portion of said sintered ceramic body, said metallic layer being formed of a metal having a high melting point such that porosity of said metallic layer continuously or stepwise increases with distances from said surface of said sintered ceramic body, said metallic layer having pores in which copper or a silver/copper-based alloy is contained, so that a ratio of a percentage content of said copper or said silver/copper-based alloy to a percentage content of the high-melting-point metal substantially continuously or stepwise increases with said distances from said surface of said sintered ceramic body; and a nickel layer provided at an interface of said high-melting-point metal and said copper or said silver/copper-based alloy in said metallic layer.

2. A process of producing a ceramic-metal composite structure, comprising the steps of:

a metalizing step of forming, on a surface of at least a portion of a ceramic body, a porous metallic layer using a high-melting-point metal such that porosity of said metallic layer continuously or stepwise increases with distances from said surface of said ceramic body, said metallic layer having a multiplicity of pores including externally open pores, a forming step of forming a nickel layer on internal surfaces of said metallic layer which define the multiple pores including the externally open pores in said metallic layer, and an impregnating step of impregnating copper or a silver/copper-based alloy in said multiple pores of said metallic layer through the externally open pores.

3. A ceramic-metal composite structure comprising:

a sintered ceramic body;

a first metallic layer which is formed of a metal having a high melting point such that porosity of said first metallic layer continuously or stepwise increases with distances from a first one of opposite surfaces of said sintered ceramic body, said first metallic layer having pores in which copper or a silver/copper-based alloy is contained, so that a ratio of a percentage content of said copper or said silver/copper-based alloy to a percentage content of the high-melting-point metal substantially continuously or stepwise increases with said distances from said first surface of said sintered ceramic body;

a second metallic layer which is formed of said high-melting-point metal such that porosity of said second metallic layer continuously or stepwise increases with distances from a second one of opposite surfaces of said sintered ceramic body, said second metallic layer having pores in which said copper or said silver/copper-based alloy is contained, so that a ratio of a percentage content of said copper or said silver/copper-based alloy to a percentage content of the high-melting-point metal substantially continuously or stepwise increases with said distances from said second surface of said sintered ceramic body;

a first metallic body bonded to said first surface of said sintered ceramic body via said first metallic layer; and a second metallic body bonded to said second surface of said sintered ceramic body via said second metallic layer.

4. The composite structure as set forth in claim 3, wherein said high-melting-point metal is tungsten or molybdenum.

5. The composite structure as set forth in claim 3, wherein said sintered ceramic body provides a substrate for said first and second metallic bodies selected from the group consisting of a copper sheet or a copper-alloy sheet.

6. The composite structure as set forth in claim 3, wherein said sintered ceramic body is constituted by a sintered alumina body or a sintered aluminum nitride body.

7. A ceramic-metal composite structure comprising:

a sintered ceramic body;

a metallic layer;

a metallic body bonded via the metallic layer to a surface of at least a portion of the sintered ceramic body;

said metallic layer being formed of a metal having a high melting point such that porosity of said metallic layer continuously or stepwise increases with distances from said surface of said sintered ceramic body, said metallic layer having pores in which copper or a silver/copper-based alloy is contained, so that a ratio of a percentage content of said copper or said silver/copper-based alloy to a percentage content of the high-melting-point metal substantially continuously or stepwise increases with said distances from said surface of said sintered ceramic body;

said sintered ceramic body providing a substrate for said metallic body selected from the group consisting of a copper sheet or a copper-alloy sheet; and a circuit pattern as at least a portion of said metallic body.

8. The composite structure as set forth in claim 7, further comprising a layer of said copper or said silver/copper-based alloy provided on a surface of said metallic layer.

9. The composite structure as set forth in claim 7, wherein said metallic layer comprises, adjacent to said sintered ceramic body, a lowermost sub-layer consisting essentially of said high-melting-point metal.

10. The composite structure as set forth in claim 7, wherein said metallic layer is formed of a composition containing, in addition to said high-melting-point metal, at least one of one or more constituents of said sintered ceramic body, said composition containing up to 30% by weight of said one constituent of said sintered ceramic body.

11. The composite structure as set forth in claim 1, wherein said metallic body is formed of one selected from copper, copper alloys, copper-plated metals, copper-cladded metals, and nickel.

12. The composite structure as set forth in claim 7, further comprising a semiconductor chip bonded to at least a portion of said metallic body, for providing a power semiconductor module.

13. The composite structure as set forth in claim 12, further comprising, in addition to said metallic layer as a first metallic layer, a second metallic layer identical with said first metallic layer; in addition to said metallic body as a first metallic body to which said semiconductor chip is bonded, a second metallic body bonded to said sintered ceramic body such that said first and second metallic bodies are bonded to opposite surfaces of said sintered ceramic body via said first and second metallic layers, respectively; and a heat sink bonded to said second metallic body.

14. A process of producing a ceramic-metal composite structure including a sintered ceramic body, a metallic layer, and a metallic body bonded via the metallic layer to a surface of at least a portion of the sintered ceramic body, the process comprising the steps of:

a metalizing step of forming, on a surface of at least a portion of a ceramic body, a porous metallic layer using a high-melting-point metal such that porosity of said metallic layer continuously or stepwise increases with distances from said surface of said ceramic body, said metallic layer having a multiplicity of pores including externally open pores, a step of forming a nickel layer on internal surfaces of said metallic layer which define said multiple pores including said externally open pores, an impregnating step of impregnating copper or a silver/copper-based alloy in the multiple pores of said metallic layer through the externally open pores, and a bonding step of bonding the metallic body to the ceramic body via the metallic layer.

15. The process as set forth in claim 14, wherein said metalizing step comprises a laminating step of laminating at least two metallic sub-layers on a surface of a formed ceramic body or a ceramic body, by printing using at least two kinds of metal-based pastes each of which contains as an essential constituent thereof said high-melting-point metal and which have different porosities after being sintered, in an order that a paste having a lower porosity after being sintered is printed before a paste having a higher porosity after being sintered; and a sintering step of firing, after said laminating step, the laminated metallic sub-layers and said formed or ceramic body under prescribed conditions.

16. The process as set forth in claim 14, wherein said metalizing step comprises a laminating step of laminating at least two metallic sub-layers on a surface of a formed ceramic body or a ceramic body, by superposing at least two green sheets each of which contains as an essential constituent thereof said high-melting-point metal and which have different porosities after being sintered, in an order that a paste having a lower porosity after being sintered is printed before a paste having a higher porosity after being sintered, and subsequently compressing the laminated metallic sub-layers; and a sintering step of firing, after said laminating step, said laminated metallic sub-layers and said formed or ceramic body under prescribed conditions.

17. The process as set forth in claim 14, wherein said impregnating step comprises a step of forming a layer of said copper or said silver/copper-based alloy on a surface of said metallic layer opposite to the surface thereof bonded to said ceramic body; and a step of heating the layer of said copper or said silver/copper alloy on said metallic layer under prescribed conditions.

18. The process as set forth in claim 17, wherein said step of forming the layer of said copper or said silver/copper-based alloy comprises a step of placing a foil of said copper or said silver/copper-based alloy on the surface of said metallic layer opposite to the surface thereof bonded to said ceramic body.

19. A process of producing a ceramic-metal composite structure including a ceramic body, a metallic layer, and a metallic body bonded via the metallic layer to a surface of at least a portion of the ceramic body, the process comprising the steps of:

a metalizing step of forming, on a surface of at least a portion of a ceramic body, a porous metallic layer using a high-melting-point metal such that porosity of said metallic layer continuously or stepwise increases with distances from said surface of said ceramic body, said metallic layer having a multiplicity of pores including externally open pores, an impregnating step of impregnating copper or a silver/copper-based alloy in the multiple pores of said metallic layer through the externally open pores, and a bonding step of bonding the metallic body to the ceramic body via the metallic layer, wherein said impregnating step comprises a step of forming a layer of said copper or said silver/copper-based alloy, by printing using a paste of said copper or said silver/copper-based alloy, on a surface of said metallic layer opposite to the surface thereof bonded to said ceramic body, and a step of heating the layer of said copper or said silver/copper-based alloy on said metallic layer under prescribed conditions.

20. A process of producing a ceramic-metal composite structure including a ceramic body, a metallic layer, and a metallic body bonded via the metallic layer to a surface of at least a portion of the ceramic body, the process comprising the steps of:

a metalizing step of forming, on a surface of at least a portion of a ceramic body, a porous metallic layer using a high-melting-point metal such that porosity of said metallic layer continuously or stepwise increases with distances from said surface of said ceramic body, said metallic layer having a multiplicity of pores including externally open pores, an impregnating step of impregnating copper or a silver/copper-based alloy in the multiple pores of said metallic layer through the externally open pores, and a bonding step of bonding the metallic body to the ceramic body via the metallic layer, wherein said impregnating and bonding steps comprise a step of forming a layer of said copper or said silver/copper-based alloy on a surface of said metallic layer opposite to the surface thereof bonded to said ceramic body, a step of placing said metallic body in contact with a surface of the layer of said copper or said silver/copper-based alloy opposite to the surface thereof in contact with said metallic layer, and a step of heating, under prescribed conditions, the layer of said copper or said silver/copper-based alloy in contact with said metallic body and said metallic layer.

* * * * *